United States Patent [19]
Gascoyne et al.

[11] Patent Number: 5,886,900
[45] Date of Patent: Mar. 23, 1999

[54] PROTECTION OF PROPRIETARY CIRCUIT DESIGNS DURING GATE LEVEL STATIC TIMING ANALYSIS

[75] Inventors: William H. Gascoyne, San Jose; Jay S. Hidy, Saratoga, both of Calif.

[73] Assignee: LSI Logic Gorporation

[21] Appl. No.: 719,508

[22] Filed: Sep. 25, 1996

[51] Int. Cl.$^6$ .................................................. G06F 17/50
[52] U.S. Cl. ........................................... 364/490; 364/488
[58] Field of Search .................................... 364/488, 489, 364/490, 491, 578; 371/22.1, 27.1, 27.2, 27.4

[56] References Cited

U.S. PATENT DOCUMENTS

| | | | |
|---|---|---|---|
| 4,477,904 | 10/1984 | Thorsrud | 371/49 |
| 4,625,310 | 11/1986 | Mercer | 371/15 |
| 5,096,454 | 3/1992 | Huang | 364/578 |
| 5,210,700 | 5/1993 | Tom | 364/489 |
| 5,331,570 | 7/1994 | Bershteyn | 364/489 |
| 5,452,239 | 9/1995 | Dai et al. | 364/578 |
| 5,475,605 | 12/1995 | Lin | 364/488 |
| 5,506,852 | 4/1996 | Chakradhar et al. | 371/27 |
| 5,517,506 | 5/1996 | Underwood et al. | 371/27 |
| 5,581,473 | 12/1996 | Rusu et al. | 364/490 |
| 5,583,787 | 12/1996 | Underwood et al. | 364/489 |
| 5,594,891 | 1/1997 | Koseko | 395/500 |

Primary Examiner—Kevin J. Teska
Assistant Examiner—Leigh Marie Garbowski
Attorney, Agent, or Firm—Oppenheimer Wolff & Donnelly LLP

[57] ABSTRACT

A method for providing a nonfunctional circuit design for evaluation in accordance with a static timing analysis is provided herein. The method initially generates a netlist, and then creates a standard delay format (SDF) file from the netlist. The standard delay format file contains occurrence names and delays associated with all elements of the design. The method subsequently selects elements of the design, alters the functionality of each selected element, and alters the standard delay format file entries corresponding to each selected element. The functional alteration of selected elements comprises altering an AND gate to be an OR gate, altering a NAND gate to be a NOR gate, altering an OR gate to be an AND gate, altering a NOR gate to be a NAND gate, altering an XOR to be an XNOR, and/or altering an XNOR to be an XOR in a predetermined manner. The method may accomplish random selection using a random number generator, or alternatively by visually selecting various design elements and altering the functionality of the gate as described. An alternative embodiment is disclosed wherein all elements having similar timing characteristics and different functionality are given identical functionality, such as all AND gates are changed to OR gates, so that all AND and OR gates have OR functionality.

32 Claims, 2 Drawing Sheets

PROTECTION OF PROPRIETARY CIRCUIT DESIGNS DURING GATE LEVEL STATIC TIMING ANALYSIS

BACKGROUND OF THE INVENTION

1. Field of the Invention

This invention relates generally to the analysis of digital circuit designs and more specifically to protecting proprietary circuit designs from being decoded and reproduced.

2. Description of the Related Art

Manufacturers and users of digital circuitry design, analyze, and test proposed designs in accordance with well known methods for optimizing both physical location of system elements and overall timing characteristics, among other parameters. The design of large ASICs can be extremely complex, time consuming, and expensive, and the tasks of creating an optimal timing arrangement, minimizing overall wire length, and creating a logical design layout frequently require many man hours.

Circuit designers are frequently called upon to design circuits for highly specialized applications. Such circuits may be produced in extremely limited quantities, making the cost of the circuits to the user, or customer extremely high in order to justify the design costs. The inherent risk specialty chip designers face is that persons may obtain these design descriptions and wish to reverse engineer the designs, thereby having the ability to appropriate the designs without incurring the expenses associated with development and design.

A necessary obstacle all manufacturers face is that they must provide users with circuit design descriptions so that both the manufacturer and the user can analyze, evaluate and verify the overall performance of the circuit model under different conditions and in connection with different factors. The designer and user are frequently concerned with circuit timing, and thus both the designer and user analyze timing using various methods at different stages of development.

A timing analysis attempts to ensure that all component timing constraints will be satisfied during normal operation of the design. The constraints may include, for example, setup and hold times for an element, and write enable timing to address a storage device, such as RAM. Timing analyses are critical to the ultimate performance of the circuit.

A timing analysis also verifies that all high level timing specifications for the circuit design have been met. These timing specifications may include cycle time and I/O timing. Timing analysis aids the manufacturer-designer and the client-user in solving any problems associated with timing, and gives a manufacturer-designer and client-user a level of confidence that the design will perform properly under certain known situations. Timing analysis also provides a means for easily and quickly analyzing different potential problem solutions without requiring a full hardware design implementation.

The analysis aids both the manufacturer-designer and the client in designing a circuit which is fast enough to meet a cycle time requirement, or selecting a range of circuit elements which will result in fast and accurate operation under specified conditions.

Two common methods for performing timing verification are the static timing analysis and the dynamic timing analysis. The dynamic timing analysis requires the design of exhaustive input stimuli to simulate circuit functionality and thus is inappropriate for early analysis and evaluation of the design. A static timing analysis generally entails determining the critical paths in the design and analyzing the delays associated with these critical paths without the need for input stimuli. The designer or user performing a static timing analysis requires no pattern stimulation to accomplish the task and does not require computer simulation, as are needed in dynamic timing analyses. A designer or user can typically perform a static timing verification in one pass, thereby requiring little computer time.

As may be readily appreciated, a client or user wanting to perform a static timing analysis needs information about the design to accurately assess system performance. The manufacturer must therefore provide the client with the system design in order to determine system performance, typically by way of presenting the user with a gate level netlist of the connections between the elements utilized in the design.

The problem with providing the system design is that all the valuable information included in the design is out of the control of the manufacturer. The manufacturer must give a product which may have taken many man hours to complete with essentially no protection for the valuable proprietary information.

It is therefore a primary object of this invention to provide means for having a client or other user perform a static timing analysis in connection with its own configuration without providing the user with a fully functional design. It is an object of the invention to prevent the appropriation of an integrated circuit design, reproduction of the design, and the avoidance of the typical design costs associated with fabrication of the circuit.

SUMMARY OF THE INVENTION

In accordance with the current invention, there is provided a method for providing a nonfunctional circuit design for evaluation in accordance with a static timing analysis. The method initially generates a netlist, and then creates a standard delay format file from the netlist. The netlist comprises a list of the elements utilized in the design and the connections between them. The standard delay format file contains occurrence names and delays associated with all elements of the design. An occurrence name is a label for an element. The method generates a standard delay format file based on the original netlist, then subsequently selects elements of the design and alters the functionality of each selected element. Occurrence names are chosen so as not to reflect the functionality of each element.

The functional alteration of the elements of randomly selected elements comprises altering an AND gate to be an OR gate, altering a NAND gate to be a NOR gate, altering an OR gate to be an AND gate, altering a NOR gate to be a NAND gate, altering an XOR gate to be an XNOR gate, and/or altering an XNOR gate to be an XOR gate. The selection method used is not critical. Selection methods may include, but are not limited to, using a random number generator, or alternatively by visually selecting various design elements, and altering the functionality as described.

An alternative embodiment of the invention entails altering the functionality of all gates having similar timing characteristics to be identical. For example, an AND gate and an OR gate have similar timing characteristics. The manufacturer can alter all AND elements to be OR elements while maintaining all OR elements to have OR functionality. The result is that all AND and OR elements will have OR functionality, providing uniform results for a static timing analysis while maintaining the proprietary status of the elements.

Other objects, features, and advantages of the present invention will become more apparent from a consideration

DETAILED DESCRIPTION OF THE INVENTION

Figure 1:
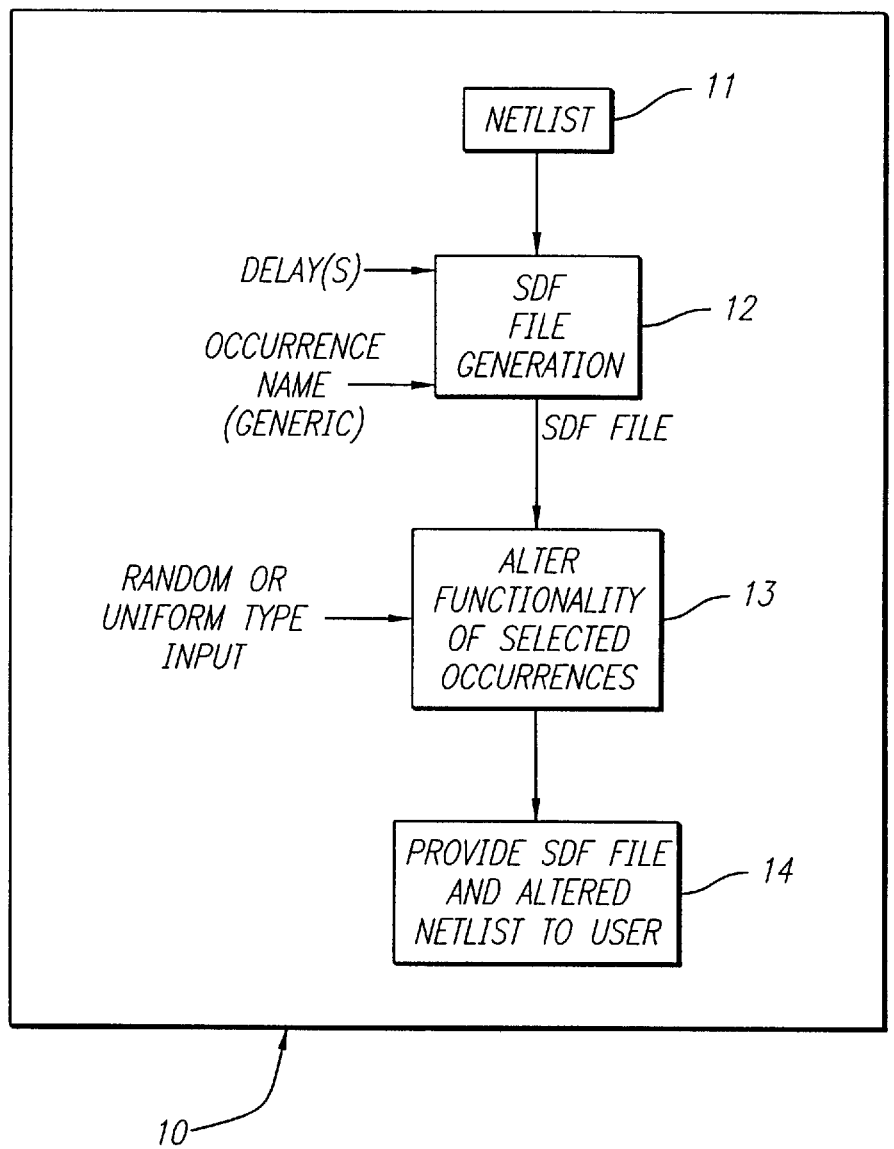
FIG. 1 illustrates a flow diagram outlining the procedures involved in the current invention.

FIG. 1 presents a flowchart 10 illustrating the current invention. Initially, the vendor produces the true gate level netlist according to the desired design in step 11. The netlist provides the description at the level of abstraction of gates, as opposed to describing the design at the transistor level or the functional level. The netlist includes a list of all digital circuit elements, including gates and other modules, included in the design, and also includes all connections between the several digital circuit elements.

The invention then assumes a means for conducting the static timing analysis. The static timing analysis sums all the delays in the various paths of the proposed circuit and compares the total delay through each path of the design for both rising and falling inputs. These delays may include more than just a single value associated with the element because in CMOS design delays differ between rising and falling, that is, whether the signal transitions from zero to one, or from one to zero. A gate may have different delay characteristics, timing characteristics, and performance depending on whether it is an AND, OR, NAND, NOR, XOR, or XNOR gate.

When the user or manufacturer performs a static timing analysis on a gate-level design, the only information the analyzer needs about the logical functioning of a particular gate is whether the gate is inverting (NOR or NAND), non-inverting (OR or AND), or indeterminate (XOR or XNOR). If the gate inverts, its output will have a particular delay associated therewith, while a gate which does not invert has a different delay characteristic. The connections between the various gates are also critical to the functioning of the static timing analysis. The length of each wire and the capacitive loading on each gate is also relevant to the timing analysis. With this information, the manufacturer or user can perform a static timing analysis.

Users wanting to perform timing analyses had previously obtained full functional designs of the circuit and performed the static timing analysis using this data. The exact type of gate and connections between the gates form the critical part of the design. The invention preserves the timing of the system while simultaneously altering the functionality of the chip to prevent appropriation of the design.

As used herein, the terms manufacturer, designer, or manufacturer-designer refer to the individual or entity producing the design for the static timing analysis and wishing to protect the proprietary designs. The terms user, client, or client-user refer to the individual or entity receiving the design from the manufacturer and performing the static timing analysis on the design.

From the netlist created in step 11, the manufacturer generates an appropriate SDF (standard delay format) file for the circuit in file generation step 12. The SDF file is created by a delay prediction program, which extracts timing and delay data from the layout and the original netlist to produce the final delays for each gate. This information is placed in a widely used standardized format, known as the SDF format, and the SDF format file can be utilized by design tools created by different vendors to perform the static timing analysis.

The delays inherent in the system design and included in the SDF files are not necessarily only for gates but for wires, multifunction modules, or entire paths, including delays from input to output of a module. Delays may be expressed within the SDF file as a range of times bounded by minimum and maximum values. Each element may have its delay specified as two minimum/maximum ranges to model both signal rise and signal fall conditions with separate and distinct delays in the CMOS design. The delay from any source or element along a wire to each different load on that wire may be specified separately in the SDF file.

The SDF file contains no cell or gate names, but only occurrence names. As used herein, an occurrence name represents an element of the design, such as a gate, wire, module, or other item in the design having a delay associated therewith. The completed SDF file is a list which identifies each gate and module within the design by the hierarchial path name from the netlist. The path name is based on the net name, where a net represents a connection between cells. The listing is completely arbitrary with respect to the ordering of the occurrences, and the ordering of paths on the design. For example, the first occurrence in the SDF file may be a gate located at the center of the design. The instance name included in the SDF file is simply an arbitrary label associated with each operation, and the instance name and the delay associated with the instance comprise the information included in the SDF file. For example, the fourth AND gate in a net may be designated UZ04, and a delay of 0.001 may be associated with the particular AND gate. This information is included in the SDF file.

The occurrence name must not include any indication of the function of the gate to preserve the timing while masking the function of the gate. For example, an occurrence name for an AND gate should not appear as AND_01, or A01, or some other such designation which indicates the function of the gate or occurrence. Such a naming relationship is only acceptable when misdescriptive, i.e. the user cannot correlate the function of the gates with the name given to each gate. An example of misdescription would be when all gates are given the designation NXXX, with XXX as a three digit designator. The N designator could theoretically indicate a NOR gate, but with all gates given the same N designation it is impossible for the end user to determine the functionality of the gate.

It is preferred to use a single universal nomenclature, or designator, for all occurrences. For example, the occurrences may have the name U001 for the first OR gate, U002 for the first NAND gate, U003 for the second OR gate, U004 for the first multifunction module, and so on.

Once the manufacturer has created the SDF file, the design is reviewed and the manufacturer alters the functionality of selected gates in functionality alteration step 13. For selected gates, a NAND gate is changed to a NOR gate, an AND gate is changed to an OR gate, a NOR gate is changed to a NAND gate, an OR gate changed to an AND gate, an XOR gate is changed to an XNOR gate, and/or an XNOR gate is changed to an XOR gate. This mechanization is illustrated in Table 1.

TABLE 1

| Original Gate Function | Altered Gate Function |
|---|---|
| AND | OR |
| NAND | NOR |
| OR | AND |
| NOR | NAND |
| XOR | XNOR |
| XNOR | XOR |

The alteration of the functionality of the individual gates preserves the timing and delays associated with the gate while altering the functionality associated therewith. As noted above, the key to the timing sequencing is whether the function inverts the signal, and thus the timing characteristics of the gate are preserved even if the functionality of each gate is altered in accordance with Table 1. Thus alteration of the functionality in accordance with Table 1 permits a user to conduct a static timing analysis while changing the overall function of the design.

As may be appreciated, alteration of all gates in accordance with Table 1 will yield a different functional design, but could be easily decoded by a user wishing to appropriate the system design. Thus an irregular procedure for altering the functionality of the design is required to prevent detecting the actual design.

In general, gate selection may be accomplished using any partially random or pseudo-random method for altering gates in accordance with functionality alteration step 12. For example, a random number generator may be used to determine the total number of gates which should be functionally altered, and the particular individual gate numbers which the designer could alter. Gates may be numbered from 1 to N where N may be the total number of occurrences in the SDF file. The random number generator could then be easily designed which would provide a listing of the occurrences which must be changed. Most ordinary calculators and computers provide a random number generator. This random number method provides the manufacturer with the capability to mask the functions altered.

An alternate method of providing randomness to the function alteration would be for the designer to choose a number of gates in the design and alter the function of those based on the desires of the designer. As may be appreciated by one of ordinary skill in the art, the method of randomness is relatively unimportant in selecting occurrences for alteration, while at the same time the concept of alteration is highly important. Any general method of somewhat randomly altering the AND, OR, NAND, NOR, XOR, and XNOR gates included in the design would sufficiently satisfy the requirements of the invention and would be within the scope of the invention herein contemplated.

Once the netlist file has been altered according to functionality alteration step 13, the SDF file and the altered netlist file are presented to the user so that the user can perform the static timing analysis in providing step 14.

Figure 2:
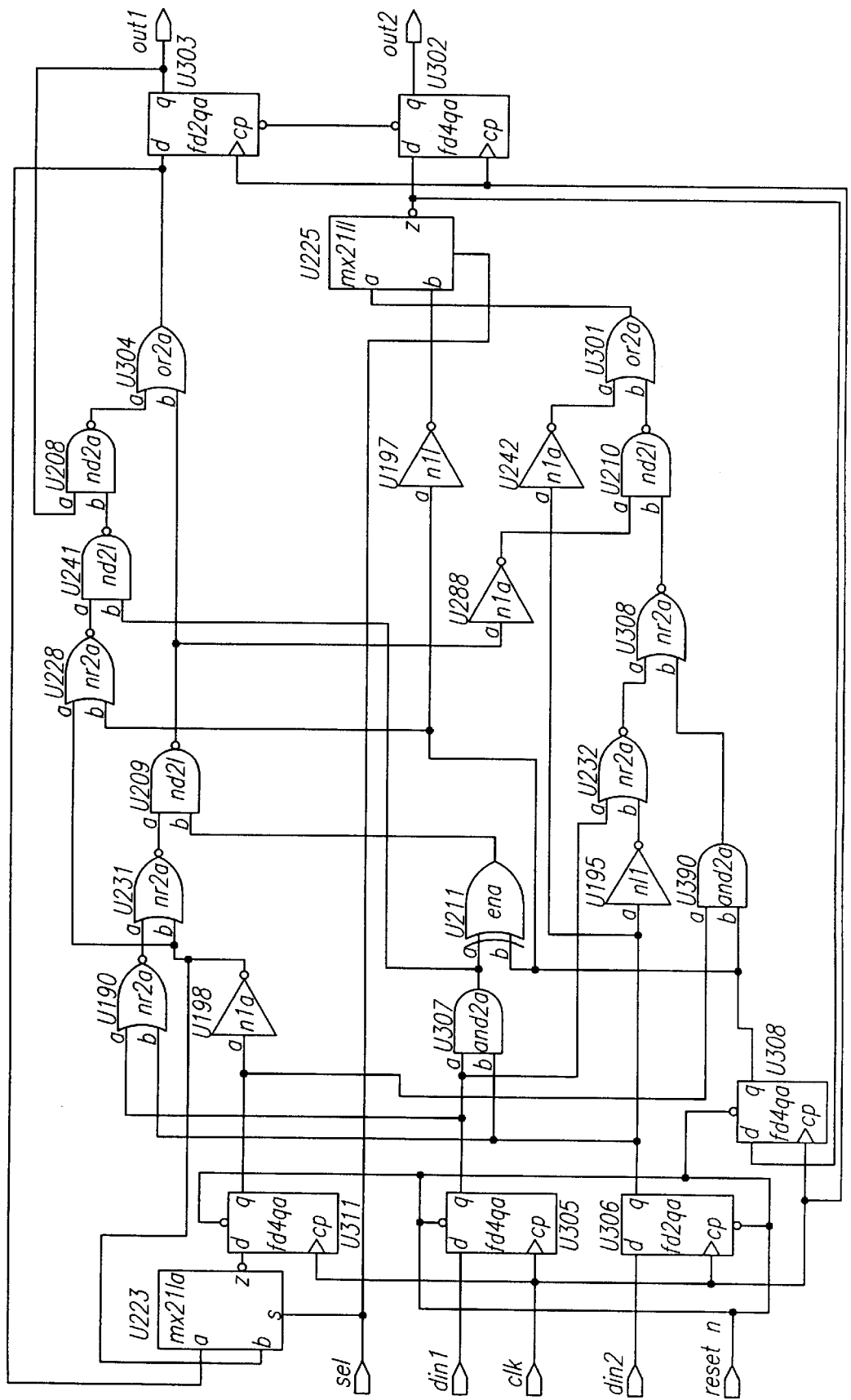
FIG. 2 shows a gate level design wherein the invention is incorporated.

An example of a design employing the functionality alteration procedure disclosed herein is presented in FIG. 2. Various elements are represented, including several gates having AND, OR, NAND, and NOR functionality. Other elements present in this design are flip-flops and multiplexers. Note that occurrences in FIG. 2 are labelled as UXXX, with XXX being a designated number having nothing to do with the functionality of the element. For example, occurrence U241 represents a NAND gate, and the 241 designation does not correlate the gate with other NAND gates in the design.

Based on this design, the manufacturer generates an SDF file containing the occurrence names and the delays associated with the occurrence according to SDF file generation step 11. The designer then selects a set of gates and changes the functionality of those gates according to step 12.

In FIG. 2, the designer selects six gates to alter, labelled as gates U190, U209, U229, U300, U309, and U301. The functionality of these gates is changed in the netlist file according to Table 1 and the manufacturer may present this completed altered file to the user along with the SDF file for static timing analysis.

As shown in FIG. 2, and according to the invention described above, the only alterations for the system are in the AND, OR, NAND, NOR, XOR and XNOR gates. Other elements, such as flip-flops and multiplexers, are not changed in accordance with the invention.

An alternative embodiment of the invention entails altering the functionality of all gates having similar timing characteristics to be identical. For example, as noted above, an AND gate and an OR gate have similar timing characteristics. The manufacturer can alter all AND elements to be OR elements while maintaining all OR elements to have OR functionality. The result is that all AND and OR elements will have OR functionality, providing uniform results for a static timing analysis while maintaining the proprietary status of the elements. The most prudent method for maintaining the security of the system is to alter all groups of gates to a single function, where groups include (1) AND and OR gates; (2) NAND and NOR gates; and (3) XOR and XNOR gates. The best method would be to alter all AND gates to OR gates, or OR gates to AND gates, all NAND gates to NOR gates or NOR gates to NAND gates, and all XOR gates to XNOR gates or XNOR gates to XOR gates. Depending on the complexity and interaction of the design, however, altering the functionality of only a single gate group may be sufficient to inhibit compromising the proprietary nature of the designs.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

We claim:

1. A method for providing a nonfunctional circuit design for evaluation purposes including static timing analysis, comprising the steps of:

selecting predetermined circuit elements of a netlist comprising a plurality of circuit elements;

altering functionality of each selected circuit element; and altering said netlist according to said altered circuit elements.

2. The method of claim 1, further comprising the steps of:

generating said netlist; and creating a standard delay format file from said netlist, said standard delay format file comprising occurrence names and delays associated with said plurality of circuit elements of said netlist.

3. The method of claim 2, wherein said netlist comprises a list of connections between said plurality of circuit elements of said netlist.

4. The method of claim 1 wherein said functionality altering step comprises altering at least one AND gate to be an OR gate.

5. The method of claim 1 wherein said functionality altering step comprises altering at least one NAND gate to be a NOR gate.

6. The method of claim 1 wherein said functionality altering step comprises altering at least one OR gate to be an AND gate.

7. The method of claim 1 wherein said functionality altering step comprises altering at least one NOR gate to be a NAND gate.

8. The method of claim 1 wherein said functionality altering step comprises altering at least one XOR gate to be an XNOR gate.

9. The method of claim 1 wherein said functionality altering step comprises altering at least one XNOR gate to be an XOR gate.

10. The method of claim 1 wherein said selecting step utilizes a random number generator.

11. The method of claim 1 wherein said selecting step comprises randomly selecting various circuit elements.

12. The method of claim 1 wherein said functionality altering step comprises:

altering an AND gate to be an OR gate;

altering a NAND gate to be a NOR gate;

altering an OR gate to be an AND gate;

altering a NOR gate to be a NAND gate;

altering an XOR gate to be an XNOR gate; and altering an XNOR gate to be an XOR gate.

13. A method for providing a gate level system design to a user for performing analysis including a static timing analysis which inhibits capture of the system design, comprising the steps of:

generating a standard delay format file, wherein said file contains occurrence names and delays associated with said occurrence names; and selecting circuit elements of a netlist which comprises a plurality of circuit elements;

altering functionality of said selected circuit elements while maintaining timing information associated with said selected circuit elements in said netlist.

14. The method of claim 13 wherein said circuit element altering step comprises altering at least one NOR gate to be a NAND gate.

15. The method of claim 13 wherein said circuit element altering step comprises altering at least one XOR gate to be an XNOR gate.

16. The method of claim 13 wherein said selected circuit elements comprise logic gates.

17. The method of claim 16 wherein said functionality altering step comprises:

altering an AND gate to be an OR gate;

altering a NAND gate to be a NOR gate;

altering an OR gate to be an AND gate;

altering a NOR gate to be a NAND gate;

altering an XOR gate to be an XNOR gate; and altering an XNOR gate to be an XOR gate.

18. The method of claim 16 wherein said functionality altering step comprises altering the functionality of a group of gates having equal timing and different functionality to function uniformly.

19. The method of claim 13 wherein said circuit element altering step comprises altering at least one XNOR gate to be an XOR gate.

20. The method of claim 13 wherein said functionality altering step comprises:

changing each AND gate to an OR gate;

changing each NAND gate to a NOR gate;

changing each OR gate to an AND gate;

changing each NOR gate to a NAND gate;

changing each XOR gate to an XNOR gate;

changing each XNOR gate to an XOR gate.

21. The method of claim 20, wherein said format creation step further comprises:

generating said netlist; and creating the standard delay format file from said netlist.

22. The method of claim 21, wherein said netlist comprises a list of connections between said plurality of circuit elements in said netlist.

23. The method of claim 13 wherein said circuit element altering step comprises altering at least one AND gate to be an OR gate.

24. The method of claim 13 wherein said circuit element altering step comprises altering at lest one NAND gate to be a NOR gate.

25. The method of claim 13 wherein said circuit element altering step comprises altering at lest one OR gate to be an AND gate.

26. A method for providing an altered electronic device design of an electronic device design to a user, said altered device design capable of providing timing information for performing a static timing analysis while masking actual performance of the electronic device design, said method comprising:

creating a netlist comprising a plurality of circuit elements;

creating a standard delay format file based on said netlist;

altering one of said plurality of circuit elements in said netlist in a predetermined manner.

27. The method of claim 26 wherein said predetermined manner comprises selecting gates and altering their functionality according to a predetermined scheme, said predetermined scheme providing alternate functionality for selected circuit elements and equivalent timing parameters for said gates.

28. The method of claim 27 wherein said predetermined scheme comprises:

replacing an AND gate with an OR gate;

replacing a NAND gate with a NOR gate;

replacing an OR gate with an AND gate;

replacing a NOR gate with a NAND gate;

replacing an XOR gate with an XNOR gate; and replacing an XNOR gate with an XOR gate.

29. The method of claim 26 wherein said altering step comprises replacing predetermined circuit elements of the design with elements having similar timing and different functionality.

30. The method of claim 29 wherein said altering step comprises:

selecting circuit elements from said plurality of circuit elements of said netlist;

altering functionality of each of said selected circuit elements; and altering netlist entries corresponding to said selected circuit elements.

31. The method of claim 29 wherein said standard delay format file contains an occurrence name associated with each of said plurality of circuit elements of said netlist and delay information associated with said occurrence.

32. The method of claim 29 wherein said circuit element selecting step comprises random selection.

* * * * *